United States Patent [19]

Aigo

[11] Patent Number: 4,525,938
[45] Date of Patent: Jul. 2, 1985

[54] SPIN DRIER FOR SEMICONDUCTOR MATERIAL

[76] Inventor: Seiichiro Aigo, 3-15-13, Negishi, Daito-ku, Tokyo, Japan

[21] Appl. No.: 569,455

[22] Filed: Jan. 9, 1984

[51] Int. Cl.³ .............................................. F26B 17/32
[52] U.S. Cl. ............................................ 34/58; 34/8; 34/69
[58] Field of Search ................. 34/8, 58, 69; 494/13, 494/55; 15/310, 311

[56] References Cited

U.S. PATENT DOCUMENTS 4,087,924  5/1978  Fujimoro ............................ 34/58
4,445,281  5/1984  Aigoo ................................. 34/58

Primary Examiner—Larry I. Schwartz
Attorney, Agent, or Firm—Cantor and Lessler

[57] ABSTRACT

A spin drier including a casing and a rotor equipped with at least one holder for a carrier, which is adapted to enclose a semiconductor material such as a silicon wafer therein, and embraced in the casing so that the semiconductor material placed on the rotor is dried by a gas stream which has been introduced through an intake port provided above the rotor, passes through the rotor and is to be exhausted through an exhaust port formed through a circumferential wall of the casing. The rotor is provided with at least three guide members on the outer section thereof, and each guide member includes a substantially vertically disposed curved surface with its convex side faced inwardly. The described holder is positioned between two guide members, to thereby guide the above described gas flow and thus prevent water, dusts and/or stains located on the bottom wall and circumferential wall of the casing from flowing back onto the semiconductor materials.

9 Claims, 7 Drawing Figures

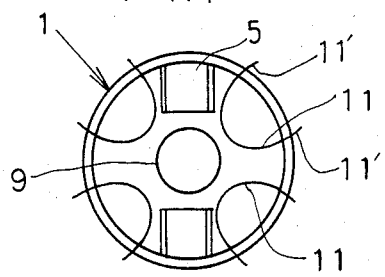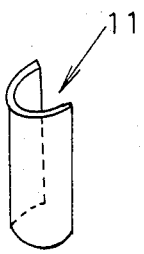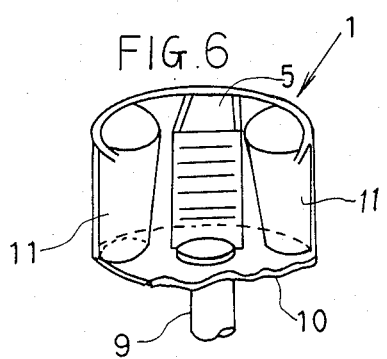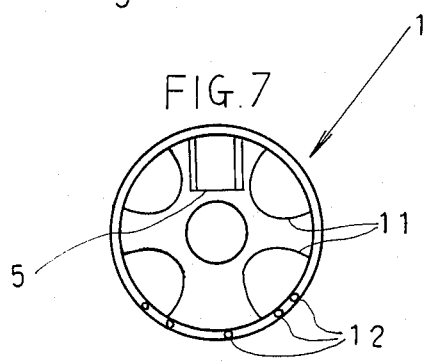

SPIN DRIER FOR SEMICONDUCTOR MATERIAL

BACKGROUND OF THE INVENTION (1) Field of the Invention

This invention relates to an improvement in an apparatus adapted to remove water droplets stuck on the surface of semiconductor material such as semiconductor silicon wafers or glass photomasks by a centrifugal force and to dry the same.

(2) Description of the Prior Art

The above described apparatus is used, after washing the silicon wafers with water, to remove the water and to dry the same. And, this apparatus is constructed of a rotor to be driven and a casing which embraces the rotor. The rotor is provided with one or more holders each adapted to hold a cage-shaped carrier which is adapted to enclose semiconductor material, namely, one or more carrier-holders. Otherwise, a lid centrally defining a gas intake port is provided over the casing while an exhaust port is formed in the circumferential wall of the casing. When the rotor is driven, water droplets present on the surface of the semiconductor material are thrown off by virtue of centrifugal forces applied thereto toward the circumferential wall of the casing. Since a negative pressure is developed at this time in a central region of the rotor, a drying gas such as air or nitrogen gas is sucked into the rotor through the air intake port and is then caused to flow in a circumferential direction through the casing, and is eventually discharged through the exhaust port. The semiconductor material is dried by the gas stream. In particular, this invention is concerned with an improvement in the above apparatus which includes one or two holders. For example, in an apparatus of the prior art which includes only one holder, the holder is disposed in the central region of the rotor. Thus, this apparatus has the defect that water droplets stuck on the portion of the semiconductor material located on the axis of the rotor can not be removed therefrom. On the other hand, turbulence will be caused in the rotor so that a part of the gas may flow back upwardly from the bottom wall of the casing. In some instances, gas streams which flow in the radial direction strike against the circumferential wall, thereby flowing inwardly in the radial direction. Such flows carry water from the circumferential wall and the bottom wall of the casing back onto the semiconductor material and stain the same. Such a prior art apparatus is thus accompanied with drawbacks that such gas flows lower the drying efficiency and reduce the effectiveness of the washing treatment.

SUMMARY OF THE INVENTION

An object of the present invention is to provide a spin drier which has overcome the above described problems of the prior art and in which the gas flow through the rotor is guided so as to perform effective drying, while avoiding the splashing-back problem of water droplets and stains.

In attaining the above object, the main features of the present invention reside in that at least three guide members are provided on the roter at the outer section thereof, each guide member including a substantially vertically disposed curved surface with its convex side faced inwardly, and each holder for a carrier supporting semiconductor material is positioned between two guide members.

The above and other objects, features and advantages of the present invention will become apparent from the following description and the appended claims, taken in conjunction with the accompanying drawings.

BRIEF DESCRIPTION OF THE DRAWINGS

FIG. 4 is a cross-sectional view of the spin drier, taken along the line A—A of FIG. 2;

FIG. 5 is a perspective view of a guide member provided on the rotor;

FIG. 6 is a perspective view of the rotor with a portion thereof cut away for showing another embodiment; and FIG. 7 is a top plan view of a spin drier according to a further embodiment of this invention.

DETAILED DESCRIPTION OF PREFERRED EMBODIMENTS

Figure 1:
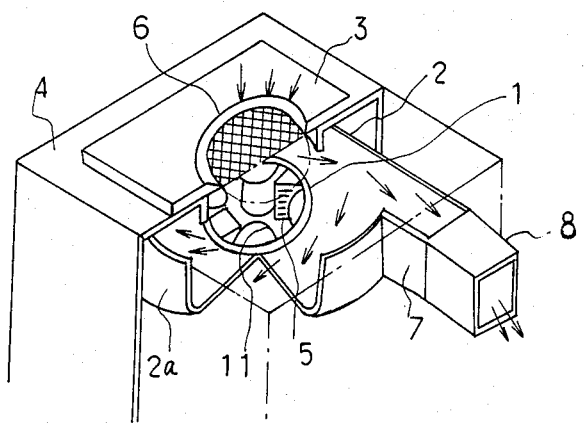
FIG. 1 is a perspective view of a spin drier according to one embodiment of this invention, in which about one half of the external housing has been cut away to give a better view of the rotor and casing.
Figure 2:
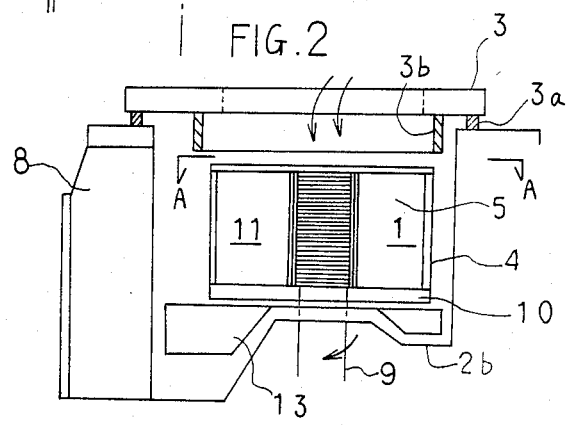
FIG. 2 is a schematic cross-sectional view of the spin drier.
Figure 3:
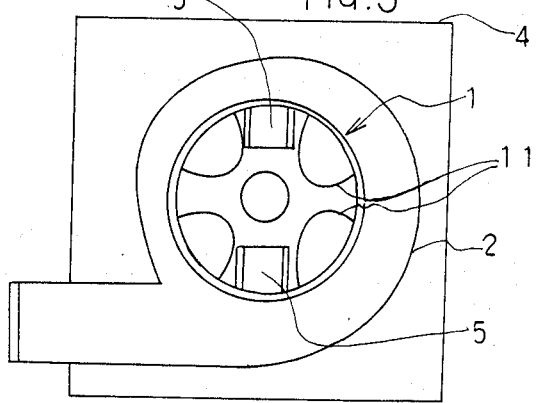
FIG. 3 is a top plan view of the spin drier, showing the interior of the spin drier.

As illustrated in FIGS. 1 to 3, the spin drier is constructed of a rotor 1, a casing 2 enclosing the rotor and a lid 3 provided above the casing 2. The rotor 1, casing 2 and lid 3 are housed in an external housing 4. Numeral 5 indicates holders adapted to hold their corresponding carriers. Semiconductor material which is to treated is enclosed in the carrier and then supported by the holder 5 provided on a bottom wall of the rotor 1. In a spin drier to which the present invention is related, one or two holders 5 are provided in the rotor 1. A gas intake port 6 is formed centrally through the lid 3, over which gas intake port 6 a screen is applied. An exhaust port 7 is provided at a suitable location in a circumferential wall 2a of the casing 2. A gas, which has been introduced through the intake port 6 due to rotation of the rotor 1, is caused to flow through the casing 2, passes through the exhaust port 7, and eventually is allowed to flow out through an exhaust duct 8. As shown in FIG. 2, a base member 10 constituting the bottom portion of the rotor 1 is connected at the center thereof with a drive shaft 9 which can be rotated by means of a motor or the like. Incidentally, numeral 3a indicates a sealing material for sealing a gap between the lid 3 and external housing 4, while numeral 3b indicates a guide provided on the lower surface of the lid 3 so as to guide a gas sucked in through the intake port 6.

The feature of this invention resides, as shown in FIGS. 3 and 4, in that at least three of guide members 11, preferably four guide members, are provided on the comparatively outer section of the rotor 1 in a spaced relation to each other, to thereby guide gas flow introduced in the rotor 1. In the illustrated embodiment, the respective guide members 11, as illustrated in FIG. 5, consist of a curved plate of which cross-section is of a curved line. These guide members are disposed substantially vertically, and the convex side of each guide member is faced inwardly. Also, each guide member 11 is preferably made of a stainless steel plate in view of strength and anticorrosion. As illustrated in FIGS. 3 and 4, the holder 5 is positioned between a pair of adjacent guide members 11 and thus positioned in an eccentric portion of the rotor 1. In some cases, three guide members 11 may be provided on the rotor. Further, the guide members 11 consist of a curved plate, while these members 11 will be a curved plate with the top thereof closed. Also the guide members consist of a hollow body.

The opposite edges of the respective guide members 11 will be consistent with the outer periphery of the rotor 1 as seen in FIG. 3, while these side edges 11' are preferably slightly projecting from the outer periphery of the rotor as seen in FIG. 4, to thereby stabilize the gas flow within the rotor. On the other hand, the respective guide members 11 will be slightly slantwise disposed downwards divergently as seen in FIG. 6, to thereby promote the gas flow more effectively.

In FIGS. 1 and 4, two holders 5 are provided, while in another embodiment only one holder 5 may be provided as seen in FIG. 7. In this embodiment, some bars or weights 12 for dynamic balancing are disposed on the rotor in a position opposed to the holder 5.

If desired, guide blades 13 will be provided between the bottom wall 2b of the casing 2 and the base member 10 of the rotor 1 as shown in FIG. 2. These guide the blades 13 serve to guide gas stream which flows downwardly toward the bottom wall 2b as well as to prevent the gas flow from flowing backward, namely upward from the bottom wall 2b of the casing 2.

Furthermore, as illustrated in FIGS. 2 and 3, it is preferable to enlarge the spacing between the rotor 1 and the circumferential wall of the casing 2 gradually in the direction of rotation of the rotor 1 toward the exhaust port 7. It is also preferable to lower the height of the bottom wall 2b of the casing 2 little by little toward the exhaust port 7 in order to facilitate the drainage of water.

When carrying out the spin-drying of semiconductor material by means of this apparatus, the carrier in which the semiconductor material has been enclosed is set on the holder 5 of the rotor and the lid 3 is closed. Then, the rotor 1 is driven. Due to the rotation of the rotor 1, the semiconductor material is also rotated and water droplets are thrown off from the semiconductor material by centrifugal forces, to thereby effect the removal of water from the semiconductor material. Also, a negative pressure is produced in the rotor 1 and a gas is allowed to flow in through the intake port 6. The majority of the gas flows through spacings between the semiconductor material, in the radial direction and outwardly through the spaces between the guide members 11 and also in the circumferential direction along the circumference wall 2a of the casing 2 and is eventually exhausted through the exhaust port 7. So, since the gas flow in outwards radial direction in the rotor is guided by means of the guide members 11, the flow is stabilized. Therefore, the semiconductor material is dried by such a gas flow.

Thus, the guide members 11 promote the gas flow in radial and outward direction in the rotor 1, and serve to prevent flowing-back of gas upwardly from the bottom wall of the casing 2 and flowing-back inwardly in the radial direction against the circumferential wall of the casing. This prevents carrying water and stains from the circumferential wall and the bottom wall of the casing back onto the semiconductor material. Therefore, there is an extremely little danger of bringing water, stains and ducts backward from the bottom wall or circumferential wall of the casing onto the semiconductor material placed on the rotor, to thereby enhance the drying efficiency.

I have now fully described the invention, it will be apparent to one of ordinary skill in the art that many changes and modifications can be made thereto without departing from the spirit or scope of the invention as set forth herein.

I claim:

1. A spin drier for semiconductor material comprising:
   (A) a generally circular casing defining a chamber having an axial gas inlet and a radial gas outlet;
   (B) a rotor disposed in said chamber, said rotor having a bottom wall;
   (C) at least one, but no more than two, semiconductor carrier holder mounted on said rotor at the periphery thereof; and
   (D) at least three inwardly-facing elongated convexly curved guide members essentially vertically disposed along the periphery of said rotor and mounted thereon;
   (E) said holder being positioned between two guide members.

2. The spin drier as defined in claim 1, having four said guide members.

3. The spin drier as defined in claim 2, having two said holders oppositely disposed.

4. The spin drier as defined in claim 2, having one said holder and further comprising sufficient counterweights on said rotor disposed opposite said holder to provide dynamic balancing.

5. The spin drier as defined in claim 1, having three said guide members.

6. The spin drier as defined in claim 1, wherein said guide members comprise a curved plate with opposed side edges slightly projecting from the outer periphery of the rotor.

7. The spin drier as defined in claim 1, wherein the guide members are generally truncated conical in shape, tapering downwardly.

8. The spin drier as defined in claim 1, wherein the casing is shaped such that the distance between the outer periphery of the rotor and the circumferential wall of the casing gradually increases, in the direction of rotation of the rotor, toward said gas outlet.

9. The spin drier as defined in claim 1, wherein said casing has a bottom wall, said bottom wall gradually sloping downwardly toward said gas outlet.

* * * * *